United States Patent
Kamiya

(10) Patent No.: US 10,483,492 B2
(45) Date of Patent: Nov. 19, 2019

(54) DISPLAY DEVICE HAVING SEALING LAYER INCLUDING DETECTION ELECTRODE

(71) Applicant: Japan Display Inc., Tokyo (JP)

(72) Inventor: Akinori Kamiya, Tokyo (JP)

(73) Assignee: Japan Display Inc., Tokyo (JP)

( * ) Notice: Subject to any disclaimer, the term of this patent is extended or adjusted under 35 U.S.C. 154(b) by 17 days.

(21) Appl. No.: 15/480,738

(22) Filed: Apr. 6, 2017

(65) Prior Publication Data

US 2017/0365813 A1    Dec. 21, 2017

(30) Foreign Application Priority Data

Jun. 16, 2016   (JP) .................................. 2016-119670

(51) Int. Cl.
*G06F 3/041*    (2006.01)
*H01L 51/52*    (2006.01)
(Continued)

(52) U.S. Cl.
CPC .......... *H01L 51/5253* (2013.01); *G06F 3/044* (2013.01); *G06F 3/0412* (2013.01); *G06F 3/0416* (2013.01); *H01L 27/323* (2013.01); *H01L 27/3276* (2013.01); *H01L 51/0097* (2013.01); *H01L 51/5293* (2013.01);
(Continued)

(58) Field of Classification Search
CPC ...... G06F 3/044; G06F 3/0412; G06F 3/0416; G02F 1/13338
See application file for complete search history.

(56) References Cited

U.S. PATENT DOCUMENTS

2015/0060817 A1    3/2015   Sato et al.
2016/0204374 A1    7/2016   Sonoda et al.
(Continued)

FOREIGN PATENT DOCUMENTS

JP    2012-099290 A    5/2012
JP    2015-050245 A    3/2015
(Continued)

OTHER PUBLICATIONS

Japanese Office Action dated Aug. 20, 2019 for the corresponding Japanese Patent Application No. 2016-119670, with partial English translation.

*Primary Examiner* — Yuzhen Shen
(74) *Attorney, Agent, or Firm* — Michael Best & Friedrich LLP

(57) ABSTRACT

A display device is provided including a pixel region arranging a plurality of pixels on a planar surface on the first side of a substrate, a sealing layer covering a surface on the opposite side of the substrate side of the pixel region, a first detection electrode extending in a direction on a layer above the pixel region on the side where the sealing layer is provided, and a second detection electrode extending in a direction intersecting with the direction in another layer different from that of the first detection electrode in a layer above the pixel region. The sealing layer including at least an organic resin film, a first inorganic insulating film, and a second inorganic insulating film, the first detection electrode or the second detection electrode is provided above the organic resin layer, the other electrode is provided below the organic resin layer.

11 Claims, 11 Drawing Sheets

(51) Int. Cl.
*G06F 3/044* (2006.01)
*H01L 27/32* (2006.01)
*H01L 51/00* (2006.01)

(52) U.S. Cl.
CPC .. *H01L 2251/301* (2013.01); *H01L 2251/303* (2013.01); *H01L 2251/5338* (2013.01); *H01L 2251/5392* (2013.01)

(56) References Cited

U.S. PATENT DOCUMENTS

| | | | |
|---|---|---|---|
| 2016/0216809 A1* | 7/2016 | Shibata | G06F 3/044 |
| 2017/0090651 A1* | 3/2017 | Kang | G06F 3/0416 |
| 2017/0243927 A1* | 8/2017 | Jeong | H01L 51/5256 |

FOREIGN PATENT DOCUMENTS

| | | | |
|---|---|---|---|
| WO | 2015/029608 A1 | 3/2015 | |
| WO | 2016/068414 | 5/2016 | |

* cited by examiner

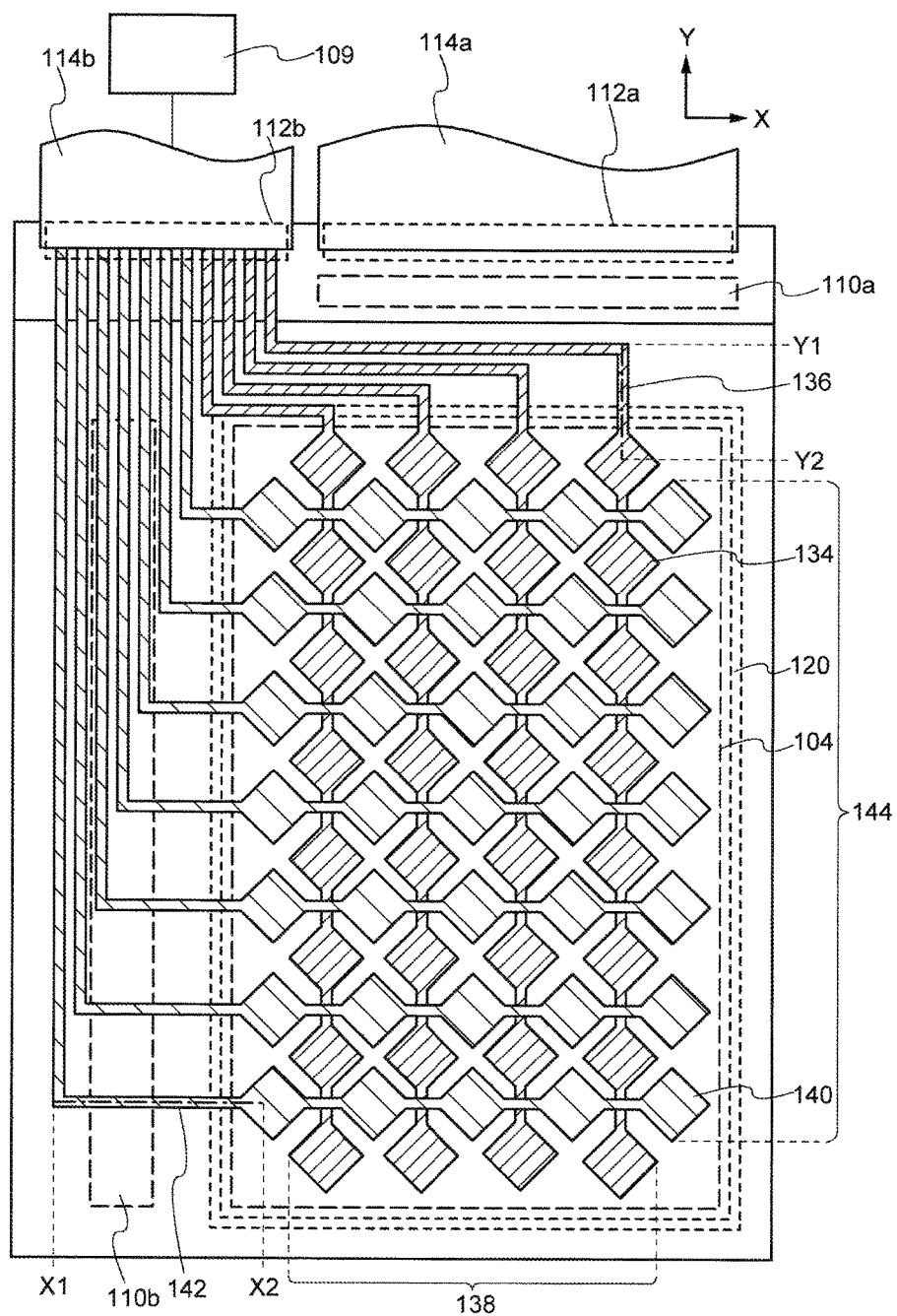

DISPLAY DEVICE HAVING SEALING LAYER INCLUDING DETECTION ELECTRODE

CROSS-REFERENCE TO RELATED APPLICATIONS

This application is based upon and claims the benefit of priority from the prior Japanese Patent Application No. 2016-119670, filed on Jun. 16, 2016, the entire contents of which are incorporated herein by reference.

FIELD

The embodiments of the present invention relate to a display device having an input function. The embodiments of the invention disclosed by this specification relate to an electrode structure of a touch sensor included in a display device.

BACKGROUND

Electronic devices in which operations are carried out by touching images such as icons displayed on a screen are commonly used. Display panels used in electronic devices such as this are called touch panels (or touch screens). In touch panels, capacitance touch sensors are used. In capacitance touch sensors, changes in electrical capacity are detected as input signals between a pair of sensor electrodes called Tx electrodes and Rx electrodes.

Conventional touch panels have a structure in which a touch sensor panel and a display panel overlap. However, In the structure in which the two panels are superimposed, there is a problem that the thickness of the display device increases. For example, in display devices that are bent and folded, called flexible displays, a structure in which a sensor panel and a display panel overlap impedes flexibility.

A structure with touch sensor functions built into a display panel is disclosed. For example, as a display panel using organic electroluminescence elements (hereinafter referred to as organic EL elements), a display device called an in-cell type provided with a touch sensor inside the panel, arranged with a first detection electrode and a second detection electrode to sandwich an inorganic insulating film provided as a sealing layer is disclosed (see Japanese Laid-Open Patent Publication No. 2015-050245.)

A sealing film provided in a display device without defects is desired. If defects exist in the sealing film, moisture and the like enter the region where display elements and circuit elements are formed, causing properties of the elements to deteriorate. For example, since the organic EL elements provided in the pixels deteriorate due to moisture and the like, defects in the sealing film cause display defects.

A dense sealing film blocking the entrance of moisture is formed in a thin film process by Plasma CVD (Chemical Vapor Deposition) method and the like. One cause of defects in the sealing film is foreign matter attached to the surface on which the film is being formed. For example, before manufacturing the sealing film, when foreign matter such as particles are attached to the surface of the substrate on which the film is formed, the sealing film is not evenly formed and defects are generated in the regions in which foreign matter is attached. As a result, moisture enters from the defective parts of the sealing film, and deterioration of the organic EL elements progresses.

A process for forming a first detection electrode before forming the sealing film is included in the display device disclosed in Japanese Laid-Open Patent Publication No. 2015-050245. It is common to form a conducting film for forming the first detection electrode by a sputtering method and the like. The film formation process by a sputtering method is one cause of the generation of foreign matter. In this process, when the sealing film is formed with foreign matter attached, defects are generated in the sealing film. Furthermore, when the second detection electrode is formed sandwiching a sealing film including defective parts, the first detection electrode and the second detection electrode short circuit.

SUMMARY

A display device according to one embodiment of the present invention includes a pixel region arranged with plurality of pixels on a planar surface on a first side of a substrate, a sealing layer covering a surface on the opposite side of the substrate side of the pixel region, a first detection electrode extending in a direction on a layer above the pixel region on the side on which the sealing layer is provided, and a second detection electrode extending in a direction intersecting with the direction in another layer different from that of the first detection electrode in a layer above the pixel region. The sealing layer including at least an organic resin film, a first inorganic insulating film provided below the organic resin film, and a second inorganic insulating film provided above the organic resin film, the first detection electrode or the second detection electrode is provided above the organic resin layer, the other electrode is provided below the organic resin layer, and both electrodes are arranged sandwiching the organic resin layer.

BRIEF DESCRIPTION OF DRAWINGS

FIG. 4 is a plan view showing the structure of the display device according to an embodiment of the present invention;

DESCRIPTION OF EMBODIMENTS

Hereinafter, the embodiments of the present invention will be described while referencing the drawings. However, the present invention may be implemented in many different ways, therefore interpretation should not be limited to the content exemplified in the embodiments below. In order to provide a clearer description, some components of the drawings such as the width, thickness, shape, etc. of each part are represented schematically. These drawings are merely examples and do not limit the interpretation of the present invention. In this specification and each of the drawings, elements similar to previously described elements are marked with the same symbols (numbers followed by a, b, and the like) and detailed descriptions are omitted accordingly. Furthermore, characters labeled as "first" and "second" are symbols used to distinguish each element, and do not have any further meaning unless otherwise specified.

In this specification, when certain components or regions are described as being "above" or "below" other components or regions, as long as there are no limitations, it does not necessarily mean they are directly above or below. This description includes cases in which a component or region is located higher or lower than another component or region. In other words, other components or regions are located between the component or region being described and the component or region above or below. Further, in the description below, unless otherwise noted, in a sectional view, the side on which the second substrate is located with respect to the substrate will be described as "above" and the other side will be described as "below."

Structure of Display Device

Figure 1:
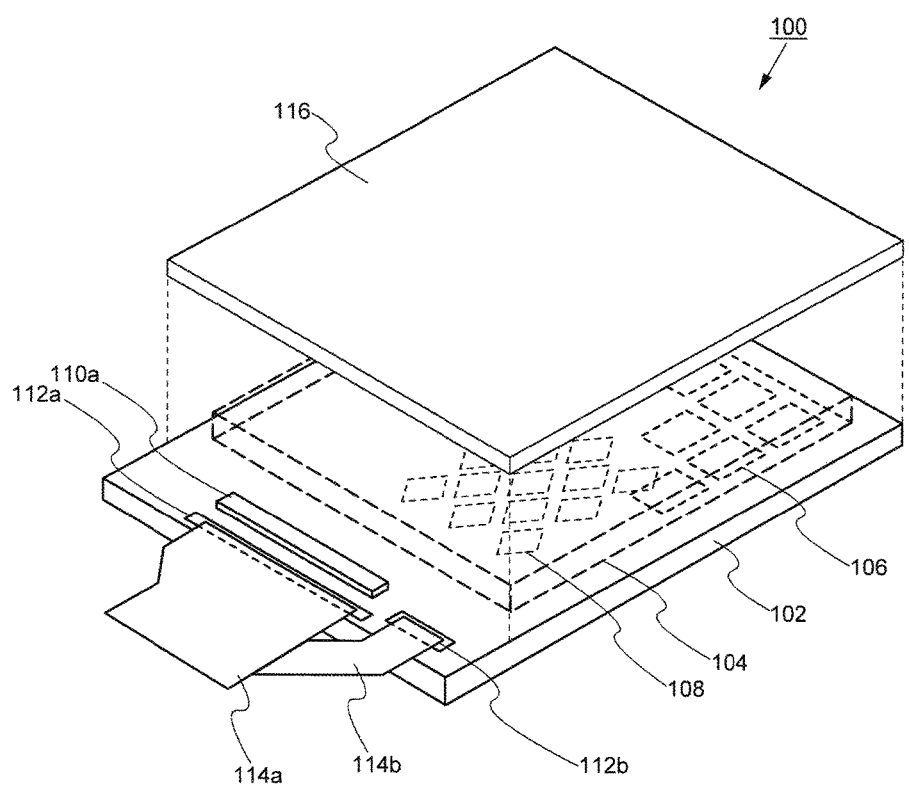
FIG. 1 is a perspective view showing the structure of a display device according to an embodiment of the present invention.

FIG. 1 shows the display device 100 according to an embodiment of the present invention in a perspective view. The display device 100 has a substrate 102 provided with a pixel region 104. In the pixel region 104, a plurality of pixels 106 are, for example, arranged in row and column directions. A touch sensor 108 is arranged overlapping the pixel region 104. The plurality of pixels 106 and the touch sensor 108 are arranged so as to overlap.

On the substrate 102, a drive circuit 110a is provided outside of the pixel region 104. A first terminal portion 112a inputting signals to the drive circuit 110a and a second terminal portion 112b outputting signals of the touch sensor 108 are arranged on the substrate 102. The first terminal portion 112a is connected to the first flexible print wiring substrate 114a, and the second terminal portion 112b is connected to the second flexible print wiring substrate 114b. The display device 100 displays image the video signals, or the like. input from the first terminal portion 112a, and outputs signals of the touch sensor 108 from the second terminal portion 112b. In FIG. 1, the first flexible print wiring substrate 114a and the second flexible print wiring substrate 114b are provided separately, but may also be provided as an integrated unit.

The substrate 102 consists of materials such as glass, plastic, (polycarbonate, polyethylene terephthalate, polyimide, polyacrylate, and the like) and the like. When the material of the substrate 102 is plastic, it is possible to make the display device 100 flexible by thinning the substrate. That is to say, by using a plastic substrate as the substrate 102, it is possible to create a flexible display.

A polarizing plate 116 including a polarizer is provided above the pixel region 104 and the touch sensor 108. For example, the polarizing plate 116 is formed by a polarizer showing circular polarization. The polarizing plate 116 is formed by a film substrate including a polarizer. Reflection (mirror surface finish) on the display screen may be prevented by providing the polarizing plate 116 overlapping the pixel region 104, Although omitted in FIG. 1, the pixel 106 includes display elements and circuit elements. The touch sensor 108 is preferably a capacitance touch sensor, formed of a first detection wiring pattern (Tx wiring pattern) and a second detection wiring pattern (Rx wiring pattern). An insulating film is located between the pixel region 104 and the touch sensor 108, arranged so as to not to electrically short each other.

Figure 2:
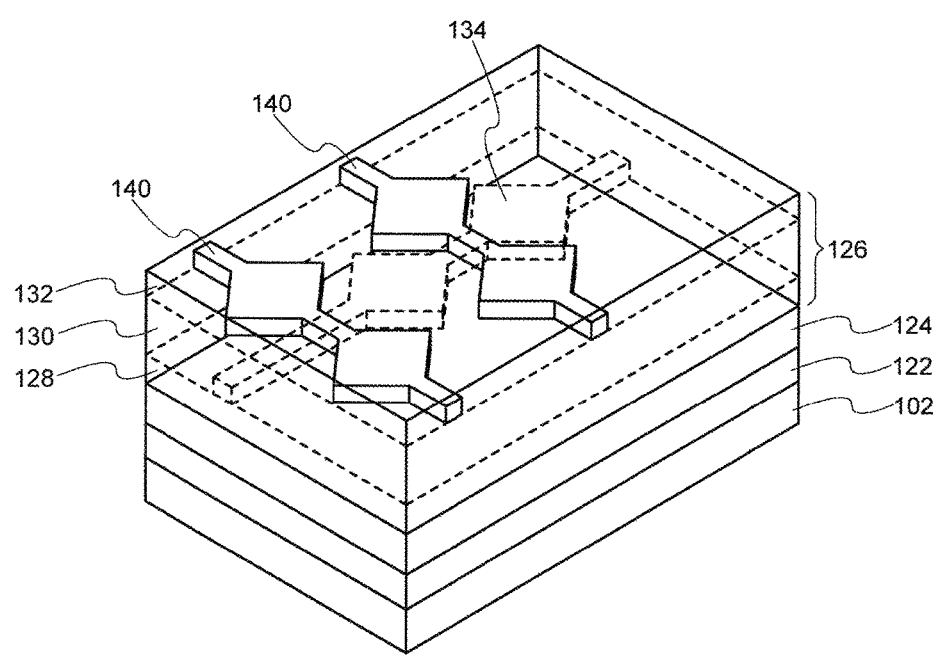
FIG. 2 is a perspective view showing the structure of a pixel region of the display device according to an embodiment of the present invention.

FIG. 2 is a perspective view showing a configuration of the touch sensor 108 arranged on the pixel region 104. As is shown in FIG. 2, the display device 100 has a structure in which a sealing layer 126 including a circuit element layer 122 provided with circuit elements, a display element layer 124 provided with display elements, and detection electrodes for use in touch sensors are stacked above the substrate 102. The sealing layer 126 is provided so as to cover the surface above the pixel region when the main surface of the observer's side is the upper side.

The circuit element layer 122 includes wiring connected to a transistor, a circuit element such as a capacitor, and a circuit element. Also, the circuit element layer 122 includes at least one layer of insulating film formed of inorganic materials, and at least one layer of a flattening film with insulating properties formed of organic resin materials. The circuit element layer 122 is a layer including a drive circuit 110 arranged on the outside of the pixel region 104. The drive circuit 110 is formed of devices such as transistors, capacitors, and resistors.

In the display element layer 124, light emitting elements or elements having an electro-optic effect by the application of voltage are utilized as display elements. If organic EL elements are used as light emitting elements, the display element layer 124 includes electrodes distinguished as an anode and cathode, an organic layer including organic EL materials, and an insulating partition layer separating the pixels formed of organic EL elements.

The pixel region 104 includes the circuit element layer 122 and the display element layer 124. For example, each pixel 106 in the pixel region 104 includes an organic EL element and a transistor that drives the organic EL elements.

The sealing layer 126 has a structure in which a plurality of films is stacked. FIG. 2 has a structure in which a first inorganic insulating film 128, an organic resin film 130, and a second inorganic insulating film 132 are stacked to form the sealing layer 126. The sealing layer 126 enhances sealing ability through a stacked structure combining different materials. For example, even if defects are included in the first inorganic insulating film 128, the organic resin layer 130 embeds the defective parts, and by providing the second inorganic insulating film 132, the sealing layer 126 has a structure that compensates for deterioration of the sealing ability caused by the defect. At this time, the second inorganic insulating film 132 may be provided so as to cover the entire surface of the pixel region 104 and at least one part of the region outside the pixel region 104, and the first inorganic insulating film 128 and the second inorganic insulating film 132 may be formed so as to cover the region further outside of the organic resin film 130. The outer peripheral end portion of the first inorganic insulating film 128 and the second inorganic insulating film 132 may not necessarily correspond.

The sealing layer 126 contains at least one of or both the first detection electrode 134 composing the touch sensor 108 and the second detection electrode 140. The first detection electrode 134 is arranged to extend in a first direction and, the second detection electrode 140 is arranged so as to extend in a second direction intersecting with the first direction. The first direction may be set in any given direction, for example, the direction along an array of pixels in the column direction. The second direction in this case may be the direction along an array of pixels in the row direction. A plurality of both the first detection electrodes 134 and the second detection electrodes 140 are arranged forming, respectively, a first detection electrode pattern and a second detection electrode pattern in the pixel region. In FIG. 2, only a part of the first detection electrode 134 and the second detection electrode 140 are shown, and a plurality of the detection electrodes are arranged side by side over almost the entire pixel region 104.

The first detection electrode 134 and the second detection electrode 140 are arranged to sandwich at least the organic resin film 130 composing the sealing layer 126. The first detection electrode 134 and the second detection electrode 140 are insulated by the organic resin film 130. That is to say, the first detection electrode 134 is arranged on one surface side of the organic resin film 130, and the second detection electrode 140 is arranged on the opposite surface side. The first detection electrode 134 and the second detection electrode 140 are insulated by sandwiching the organic resin film 130, and electrostatic capacity is generated between the detection electrodes.

FIG. 3A, FIG. 3B, FIG. 3C, and FIG. 3D schematically show the embodiments of the sealing layer 126, the first detection electrode 134, and the second detection electrode 140 in the structure in which the circuit element layer 122, the display element layer 124, and the sealing layer 126 are stacked above the substrate 102. The display element layer 124 has a structure in which a pixel electrode 170, an organic layer 172 and an opposite electrode 174 are stacked. The sealing layer 126 has a structure in which a first inorganic insulating film 128, an organic resin film 130, and a second inorganic insulating film 132 are stacked, and is arranged above the opposite electrode 174.

Figure 3A:
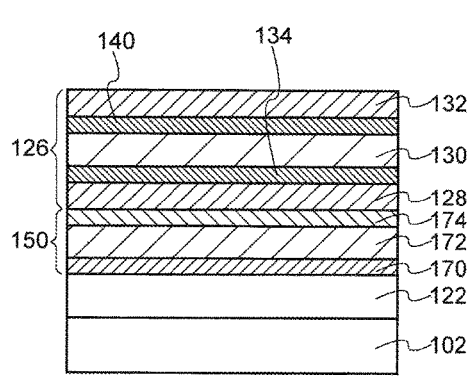
FIG. 3A, FIG. 3B, FIG. 3C and FIG. 3D are diagrams showing the structure of the display device according to an embodiment of the present invention.
Figure 3B:
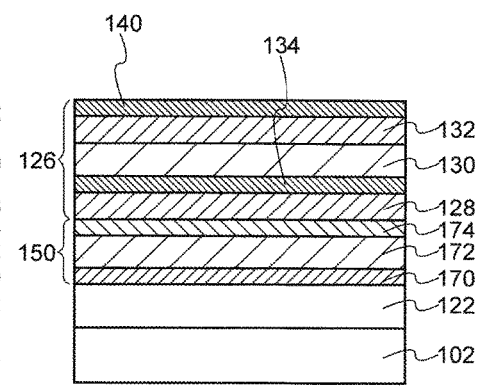
Figure 3C:
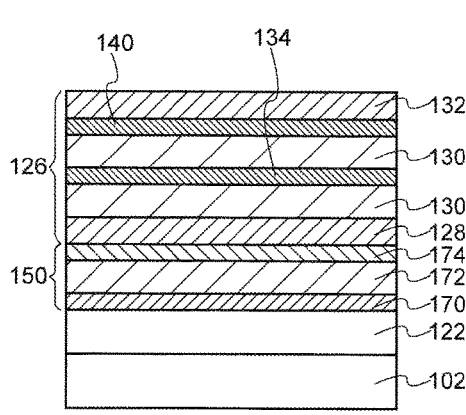
Figure 3D:
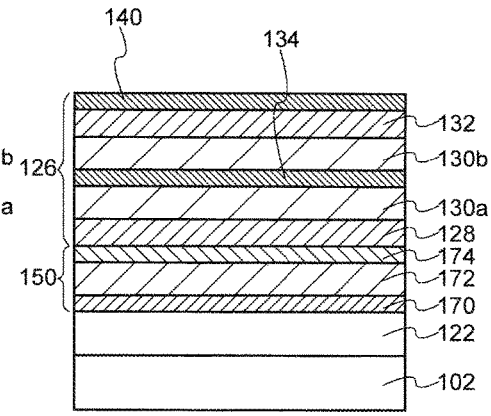

FIG. 3A shows a structure in which the first detection electrode 134 is provided between the first inorganic insulating film 128 and the organic resin film 130, and the second detection electrode 140 is provided between the organic resin film 130 and the second inorganic insulating layer 132 in the sealing layer 126. FIG. 3B shows a structure in which the first detection electrode 134 is provided between the first inorganic insulating film 128 and the organic resin film 130, and the second detection electrode 140 is provided above the second inorganic insulating film 132. In FIG. 3C, the organic resin film 130 includes at least the first organic resin film 130a and the second organic resin film 130b in the sealing layer 126. The first detection electrode 134 is provided between the first organic resin film 130a and the second organic resin film 130b, and the second detection electrode 140 is provided between the second organic resin film 130b and the second inorganic insulating film 132. In FIG. 3D, the first detection electrode 134 is provided between the first organic resin film 130a and the second organic resin film 130b, and the second detection electrode 140 is provided above the second inorganic insulating film 132.

As shown in FIG. 3A, FIG. 3B, FIG. 3C, and FIG. 3D, in any of these cases an organic resin film is sandwiched between the first detection electrode 134 and the second detection electrode 140. With a structure such as this, for example, even if foreign matter is attached when the conducting layer for forming the first detection electrode 134 is being formed and remains after the process is over, the organic resin film may embed the foreign matter. The organic resin film is formed by a coating method or a vapor deposition method, and has fluidity in a step for applying organic resin materials (or a precursor of organic resin materials) to the substrate. Therefore, even if foreign matter is partially attached, the surface of the organic resin film 130 may be substantially flattened using the properties relating to the manufacturing process of the organic resin materials to imbed the bumps caused by the foreign matter. From this, it is possible to prevent the first detection electrode 134 and the second detection electrode 140 from short circuiting.

Although not shown in FIG. 3A, FIG. 3B, FIG. 3C, and FIG. 3D, a polarizing plate may be provided above the second inorganic insulating film 132 and the second detection electrode 140.

FIG. 4 is a plan view schematically showing the arrangement of the first detection electrode 134 and the second detection electrode 140 in the display device 100. FIG. 4 shows an embodiment of a plurality of first detection electrodes 134 extending in a Y direction forming a first detection electrode pattern 138, and a plurality of second detection electrodes 140 extending in an X direction forming a second detection electrode pattern 144. The shape of the first detection electrode 134 and the second detection electrode 140 is arbitrary. The first detection electrode 134 and the second detection electrode 140 may be rectangle (stripe) shaped, or as illustrated, it may have a shape connecting the electrodes of diamond-shape. The detection sensitivity of the touch sensor 108 may be increased by using a series of connecting rectangle (stripe) shaped or diamond-shaped electrodes such as these.

The first detection electrode pattern 138 and the second detection electrode pattern 144 are arranged in a region overlapping the pixel region. The first wiring 136 of the first detection electrode 134 extracted from the pixel region 104 is connected to the second terminal portion 112b. The second wiring 142 of the second detection electrode 140 is also extracted from the pixel region 104 to the end portion of the substrate 102, arranged along the side of the substrate 102, and connected to the second terminal portion 112b. The second wiring 142 may be arranged in the region overlapping the region in which the drive circuit 110b is arranged on the substrate 102. By arranging the second wiring 142 and the drive circuit 110b to overlap, it is possible to narrow the frame of the display panel.

An opening region 120 surrounding the pixel region 104 is provided on the substrate 102. The details of the opening region 120 explained by the cross-section of the structure of the pixel region 104 will be described later. A first wiring 136 and a second wiring 142 are extracted from the pixel region 104 to the peripheral portion of the substrate 102 beyond the opening region 120.

The second terminal portion 112b is connected to the touch sensor control unit 109 via the second flexible print wiring substrate 114b. That is to say, the detection signal obtained from the first detection electrode 134 and the second detection electrode 140 is transmitted to the second terminal portion 112b by the first wiring 136 and the second wiring 142, and is output to the touch sensor control unit 109 via the second flexible print wiring substrate 114b.

In this way, in the display device 100 according to one embodiment of the present invention, the first detection electrode pattern 138 and the second detection electrode pattern 144 configuring the touch sensor are provided on the substrate 102. With this structure, the thickness of the display device 100 may be reduced. As is shown in FIG. 2, the first detection electrode 134 and the second detection electrode 140 are provided so as to be embedded in the sealing layer 126, or to come in contact with the sealing layer 126. With this structure, since a part of the sealing layer 126 is replaced with a dielectric layer because electrical capacitance is formed between the first detection electrode 134 and the second detection electrode 140, the thickness of the display device 100 may be further reduced.

Next, the details of the first detection electrode 134 and the second detection electrode 140, and the sealing layer 126 provided with these detection electrodes will be described in embodiments 1 through 4.

Embodiment 1

Figure 5:
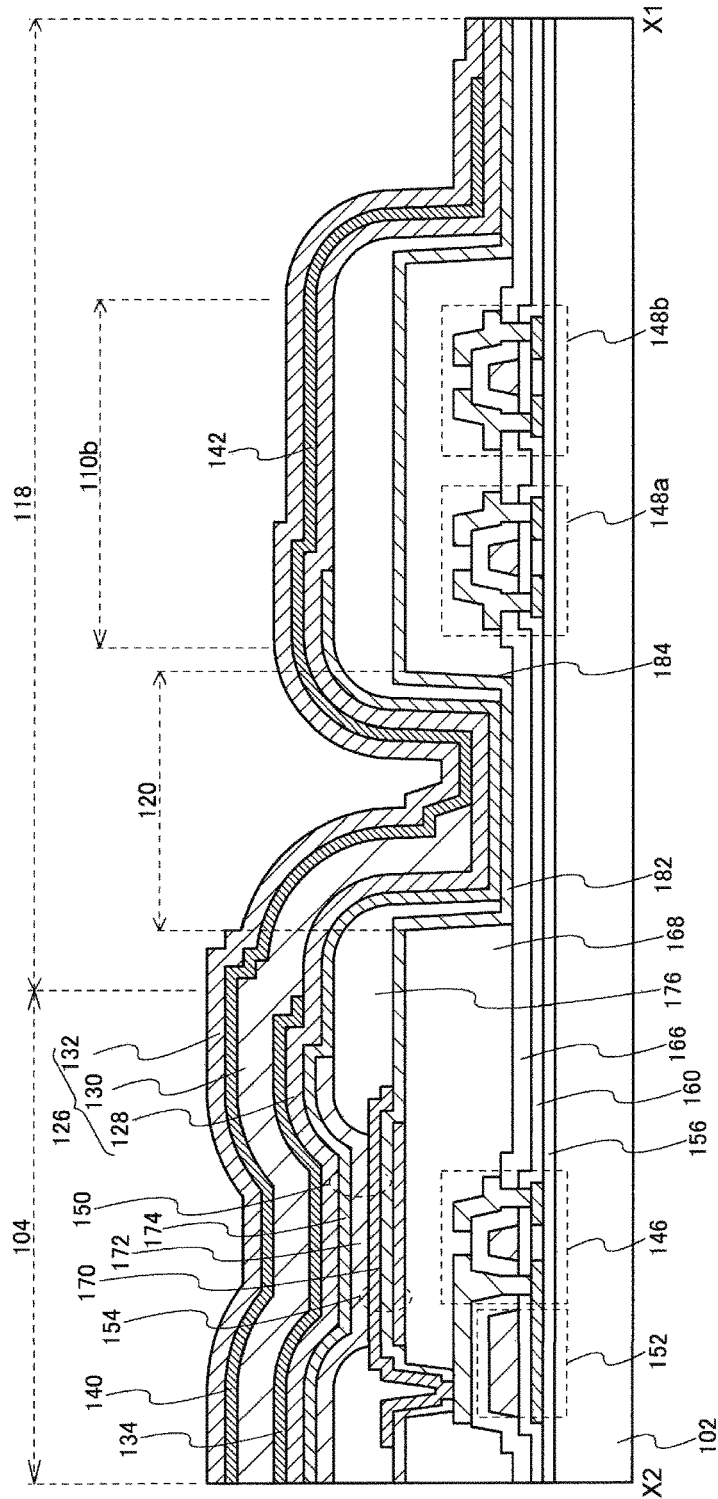
FIG. 5 is a cross-sectional view showing the structure of the display device according to an embodiment of the present invention.

FIG. 5 shows a cross-section of the structure of the display device 100 according to one embodiment of the present invention. FIG. 5 schematically shows a cross-section of the structure of the peripheral region 118 located in the pixel region 104 as well as outside of the pixel region 104. The cross-section of this structure corresponds to the structure taken along the X1-X2 line shown in FIG. 4. The structure of the sealing layer 126 as well as the first detection electrode 134 and the second detection electrode 140 shown in FIG. 5 correspond to FIG. 3A.

As is shown in FIG. 5, the pixel region 104 and the peripheral region 118 are provided above the substrate 102. The peripheral region 118 includes the opening region 120 and the drive circuit 110b. The pixel region 104 includes a transistor 146, an organic EL element 150, a first capacitive element 152, and a second capacitive element 154. The details of these elements are shown in FIG. 6.

Figure 6:
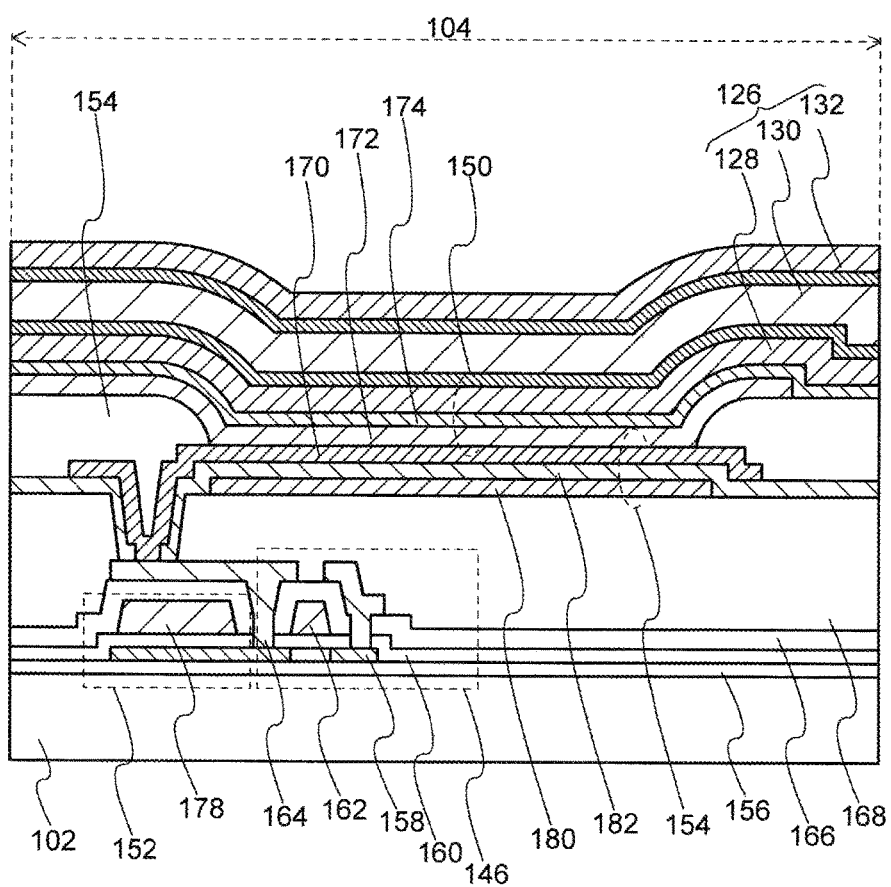
FIG. 6 is a cross-sectional view showing the structure of the pixel region of the display device according to an embodiment of the present invention.

As is shown in FIG. 6, the organic EL element 150 is electrically connected to the transistor 146. The electrical current flowing between the source and drain of the transistor 146 is controlled by the video signal applied to the gate, and the brightness of the organic EL element 150 is controlled by this current. The first capacitive element 152 maintains the gate voltage of the transistor 146, and the second capacitive element 154 is provided so as to adjust the amount of the current flowing through the organic EL element 150. The second capacitive element 154 is non-essential and may be omitted.

An underlying insulating layer 156 is provided on the first surface of the substrate 102. The transistor 146 is provided above the underlying insulating layer 156. The transistor 146 includes a structure in which a semiconductor layer 158, a gate insulating layer 160, and a gate electrode 162 are stacked. The semiconductor layer 158 is formed of amorphous or polycrystalline silicon, or oxide semiconductors. The source and drain wiring 164 is provided above the gate electrode 162 via the first insulating layer 166. The second insulating layer 168 is provided as a planarizing layer above the source and drain wiring 164. The first insulating layer 166 is formed of inorganic insulating materials such as silicon oxide and silicon nitride, and the second insulating layer 168 is formed of organic insulating materials such as polyimide and acrylic.

The organic EL element 150 is provided above the second insulating layer 168. The organic EL element 150 has a structure in which the pixel electrode 170 electrically connected to the transistor 146, the organic layer 172, and the opposite electrode 174 are stacked. The organic EL element 150 is a two-terminal element, and light emission is controlled by controlling the voltage between the pixel electrode 170 and the opposite electrode 174. A partition layer 176 is provided above the second insulating layer 168 to expose the inner region and cover the periphery of the pixel electrode 170. The opposite electrode 174 is provided above the organic layer 172. The organic layer 172 is provided from the region overlapping the pixel electrode 170 to the upper surface of the partition layer 176. The partition layer 176 is formed of organic resin materials in order to form a smooth step portion on the end portion of the pixel electrode 170 while covering the periphery of the pixel electrode 170. Acrylic, polyimide, and the like may be used as the organic resin materials.

The organic layer 172 is formed of a single layer including organic EL materials or a plurality of layers. The organic layer 172 is formed using low molecular weight or high molecular weight organic material. When a low molecular weight organic material is used, the organic layer 172 has a structure including a hole injection layer and an electron injection layer sandwiching the light emitting layer, and a hole transport layer and an electron transport layer in addition to a light emitting layer including organic EL materials. For example, the organic layer 172 may have a structure in which the light emitting layer is sandwiched between the hole injection layer and the electron injection layer. Also, in addition to a hole injection layer and an electron injection layer, a hole transport layer, an electron transport layer, a hole block layer, an electron block layer, and the like may be added as appropriate to the organic layer 172.

In the present embodiment, the organic EL element 150 has a top emission type structure in which light emitted from the organic layer 172 is emitted to the opposite electrode 174. Therefore, it is preferable that the pixel electrode 170 has light reflectivity. Other than being formed of metal materials with light reflective properties such as aluminum (Al) and silver (Ag), the pixel electrode 170 has a structure in which a transparent conductive layer made of ITO (Indium Tin Oxide) and IZO (Indium Zinc Oxide) with excellent hole-injecting properties and a light reflective metal layer are stacked.

The opposite electrode 174 is formed of a transparent conductive film such as ITO and IZO having translucency and conductivity so as to transmit the light emitted in the organic layer 172. In the interface of the opposite electrode 174 and the organic layer 172, a layer including alkali metals such as lithium and alkali earth metals such as magnesium is provided in order to improve carrier injection properties.

The first capacitive element 152 is formed in the region in which the semiconductor layer 158 and the first capacitive electrode 178 overlap using the gate insulating layer 160 as a dielectric film. The second capacitive element 154 is formed by the pixel electrode and the second capacitive electrode 180 provided overlapping the pixel electrode 170 using the third insulating layer 182 provided between the pixel electrode 170 and the second capacitive electrode 180 as a dielectric film. The third insulating layer 182 is formed of inorganic insulating materials such as silicon nitride and the like.

The sealing layer 126 is provided above the organic EL element 150. The sealing layer 126 is provided to prevent the entrance of moisture and the like into the organic EL element 150. The sealing layer 126 has a structure in which the first inorganic insulating film 128, the organic resin film 130, and the second inorganic insulating film 132 are stacked from the side of the organic EL element 150. The first inorganic insulating film 128 and the second inorganic insulating film 132 are formed of inorganic insulating materials such as silicon nitride, silicon oxynitride, aluminum oxide, and the like. The first inorganic insulating film 128 and the second inorganic insulating film 132 are formed by coating the inorganic insulating materials using a sputtering method, a plasma CVD method, or the like. The first inorganic insulating film 128 and the second inorganic insulating film 132 are formed with a thickness of 0.1 μm~10 μm, preferably 0.5 μm~5 μm.

As is shown in the later described FIG. 8A, in order to expose the region of the second terminal portion 112b, patterning by photolithography is performed after the film is formed on the entire surface of the substrate 102, or a mask is used during film formation (a metal mask having openings on the film formation surface), and it is preferable that an insulating film is not formed at least in the second terminal portion 112b.

The organic resin film 130 is preferably formed of acrylic, polyimide, epoxy, and the like. Due to the organic materials such as these, the organic resin film 130 has a thickness of 1 μm~20 μm, preferably 2 μm~10 μm. The organic resin film 130 is formed by a coating method such as spin-coating or a vapor deposition method using an organic material source. However, the organic resin film 130 is preferably formed within the predetermined region including the pixel region 104 so the end portion is sealed in the first inorganic insulating film 128 and the second inorganic insulation film 132. For example, it is preferable that the end portion (contoured portion) of the organic resin film 130 is provided in a location overlapping with the opening region 120. For this reason, it is preferable that after the organic resin film 130 is formed over the entire surface of the substrate 102 by a coating method, the peripheral region is removed by etching, or a pre-determined pattern is formed by a vapor deposition method using a mask opening the deposition surface (vapor deposition mask), inkjet printing, flexographic printing, or gravure printing.

Although omitted in FIG. 6, the polarizing plate is provided above the sealing layer 126 as is shown in FIG. 1. Other than a light polarizer, a color filter layer and a light shielding layer may be included in the polarizing plate 116 as appropriate.

The first detection electrode 134 forming the touch sensor 108 is provided between the first inorganic insulating film 128 and the organic resin film 130. The second detection electrode 140 is provided between the organic resin film 130 and the second inorganic insulating film 132. The first detection electrode 134 and the second detection electrode 140 are preferably formed of transparent conductive film in order to transmit light emitted from the organic EL element 150. The coating of the ITO and IZO film which is one type of transparent conductive film is manufactured using a sputtering method. The first detection electrode 134 and the second detection electrode 140 may be manufactured by a printing method using silver nanowire.

In the present embodiment, since the organic resin film 130 is formed above the first detection electrode 134, even if foreign matter is attached after the transparent conductive film that forms the first detection electrode is formed, the foreign matter can be covered with the organic resin film 130. This may prevent the second detection electrode 140 formed above the organic resin film 130 and the first detection electrode 134 from short circuiting. Furthermore, since the second inorganic insulating film 132 is provided above the organic resin film 130 (above the second detection electrode 140), it is possible to maintain the function of the sealing layer 126.

In FIG. 5, the drive circuit 110b included in the peripheral region 118 outside of the pixel region 104 is provided with a transistors 148a and 148b. For example, the transistor 148a is an n-channel transistor, and the transistor 148b is a p-channel transistor. The drive circuit is formed by transistors such as these.

The region called the opening region 120 is provided between the pixel region 104 and the drive circuit 110b. The opening region 120 is provided with an opening portion 184 overlapping the second insulating layer 168. The opening portion 184 is provided at least along a side of the pixel region 104. The second insulating layer 168 is divided by the opening portion 184 in the pixel region 104 and the drive circuit 110b. The partition layer 176 is also divided in the opening portion 184. The third insulating layer 182 above the second insulating layer 168 and the opposite electrode 174 provided above the partition layer 176 are provided along the side surface and the bottom surface of the opening portion 184.

The organic resin film 130 forming the sealing layer 126 is arranged in the end portion of the opening 184. The first inorganic insulating film 128 and the second inorganic insulating film 132 extend to the outside of the end portion of the organic resin film 130. From this, a structure in which the first inorganic insulating film 128 and the second inorganic insulating film 132 touch in the region outside the organic resin film 130 is formed. In other words, the organic resin film 130 is sandwiched between the first inorganic insulating film 128 and the second inorganic insulating film 132, and has a structure which does not expose the end portion. This structure can prevent the entrance of moisture and the like from the end portion of the organic resin film 130. Further, the end portion of the organic resin film 130 may be the outside of the pixel region 104, or the end portion may overlap the opening portion 184, providing a region in the opening region 120 in which the first insulating layer 166 formed of inorganic insulating materials, the third insulating layer 182, the opposite electrode 174, the first inorganic insulating film 128, the second wiring 142, the second inorganic insulating film 132 are stacked. A structure in which the layers are stacked such as this may have an improved sealing ability.

In this way, the second insulating layer 168 and the partition layer 176 formed of organic insulating materials in the peripheral region 118 are divided by the opening portion 184, and the third insulating layer 182 and the opposite electrode 174 are arranged so as to cover the side surface and the bottom surface of the opening portion 184, forming a sealing structure. The third insulating layer 182 is provided in order to connect to the first insulating layer 166 formed of inorganic materials in the bottom portion of the opening portion 184. Since the second insulating layer 168 and the partition layer 176 formed of organic insulating materials are sandwiched by layers of inorganic material, the entrance of moisture into the pixel region 104 from the end portion of the substrate 102 may be prevented. The region provided in the opening portion 184 separating the second insulating layer 168 and the partition layer 176 may function as a moisture blocking region, and this structure may be called a "moisture blocking structure."

The second wiring 142 connected to the second detection electrode 140 passes the opening region 120 and is arranged above the drive circuit 110b. The second wiring 142 further extends to the end portion side of the substrate 102. The second wiring 142 is arranged between the first inorganic insulating film 128 and the second inorganic insulating film 132. That is, the second wiring 142 is protected by the first inorganic insulating film 128 and the second inorganic insulating film 132.

Figure 7:
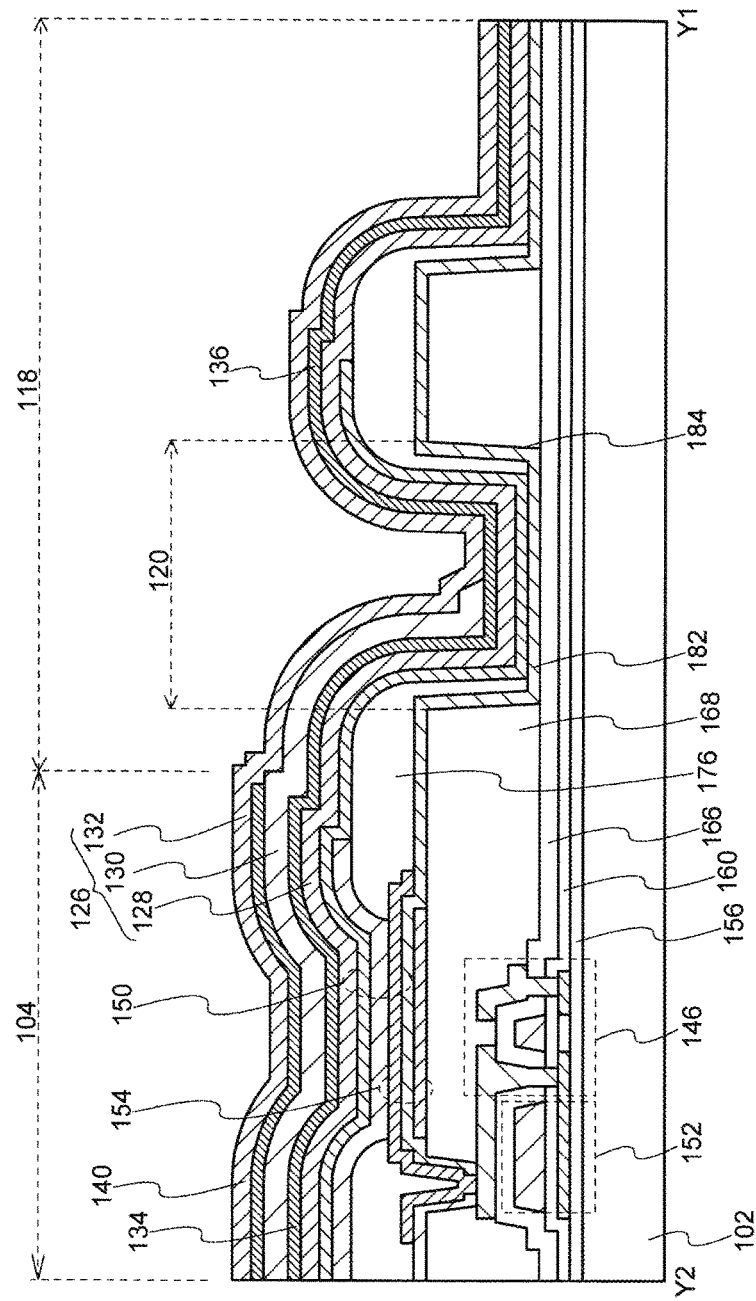
FIG. 7 is a cross-sectional view showing the structure of the display device according to an embodiment of the present invention

FIG. 7 shows a cross-section of the structure taken along the Y1-Y2 line shown in FIG. 4. The pixel region 104 and the peripheral region 118 are also shown. The opening region 120 is included in the peripheral region 118. In the opening portion 184 in the opening region 120 includes a structure in which the first insulating layer 166 formed of inorganic insulating materials, the third insulating layer 182, the opposite electrode 174, the first inorganic insulating film 128, the second detection electrode 140, and the second insulating film 132 are stacked. The first wiring 136 connected to the first detection electrode 134 is arranged along the surface above the first inorganic insulating film 128, passing the opening region 120 and extending to the end portion side of the substrate 102. The first wiring 136 is arranged between the first inorganic insulating film 128 and the second inorganic insulating film 132. From this, the first wiring 136 is protected by the first inorganic insulating film 128 and the second inorganic insulating film 132.

Figure 8A:
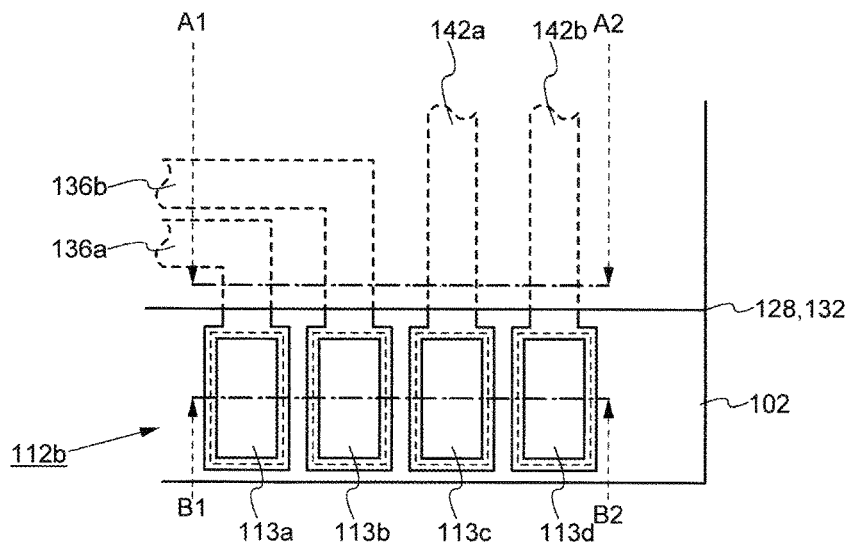
FIG. 8A is a plan view of the terminal portion of the display device according to an embodiment of the present invention.
Figure 8B:
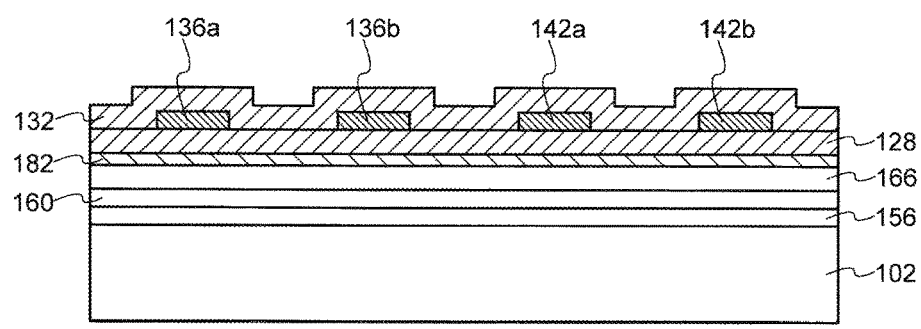
FIG. 8B is a cross-sectional view of wiring connected to the terminal electrodes of the display device according to an embodiment of the present invention.
Figure 8C:
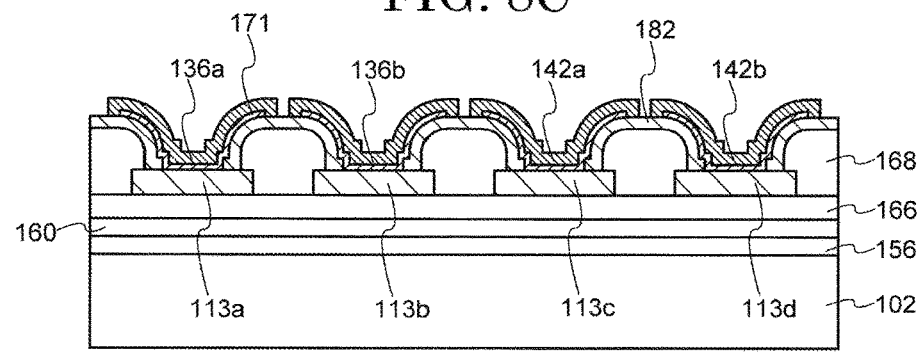
FIG. 8C is a diagram showing a cross-sectional view of the terminal electrode of the display device according to an embodiment of the present invention.

FIG. 8A, FIG. 8B, and FIG. 8C show the structure of the second terminal portion 112b connected to the first wiring 136 and the second wiring 142. FIG. 8A shows a plan view of the second terminal portion 112b. The second terminal portion 112b is arranged with of a plurality of terminal electrodes. FIG. 8A shows terminal electrodes 113a~113d in a line in the second terminal portion 112b as an example. The cross-section of the structure taken along line A1-A2 shown in FIG. 8A is shown in FIG. 8B, and the cross-section of the structure taken along line B1-B2 is shown in FIG. 8C.

The example shown in FIG. 8A shows an embodiment in which the terminal electrode 113a is connected to the first wiring 136a, the terminal electrode 113b is connected to the first wiring 136b, the terminal electrode 113c is connected to the second wiring 142a, and the terminal electrode 113d is connected to the second wiring 142b. The terminal electrodes 113a~113d are provided above the substrate 102. While the first wirings 136a and 136b, and the second wirings 142a and 142b extend out to the terminal electrodes 113a~113d, respectively, the first inorganic insulating film 128 and the second inorganic insulating film 132 are provided so as not to cover the terminal electrodes 113a~113d. That is, the end portion of the first inorganic insulating film 128 and the second insulating film 132 are arranged further inside from the end of the substrate 102, exposing the terminal electrodes 113a~113d.

FIG. 8B shows a cross-section of the structure of the peripheral region 118 in which the first wiring 136a and 136b, and the second wiring 142a and 142b are arranged. In the peripheral region 118, for example, the underlying insulating layer 156 above the substrate 102, the gate insulating layer 160, the first insulating layer 166, and the third insulating layer 182 are stacked. The first inorganic insulating film 128 and the second inorganic insulating film 132 are provided above the third insulating layer 182. The first inorganic insulating film 128 is provided below the first wiring 136a and 136b, and the second wiring 142a and 142b, and the second inorganic insulating film 132 are provided above. The first inorganic insulating film 128 and the second inorganic insulation film 132 are insulating films such as silicon nitride, silicon oxynitride, and aluminum oxide, with a high ability to act as a barrier against moisture. Since the first wiring 136a and 136b and the second wiring 142a and 142b are sandwiched between the first inorganic insulating film 128 and the second inorganic insulating film 132, they are insulated in the peripheral region 118, and corrosion from moisture and the like is prevented.

FIG. 8C shows a cross-section of the structure of the terminal electrodes 113a~113d. The terminal electrodes 113a~113d, for example, are formed by the same layer as the conductive layer forming the source and drain wiring 164. The second insulating layer 168 and the third insulating layer 182 are provided in the end portion of the terminal electrodes 113a~113d and between the terminal electrodes. From this, the regions between each terminal electrode are insulated. Since the first inorganic insulating film 128 and the second inorganic insulating film 132 are not provided in the region in which the terminal electrodes 113a~113d are provided, the first wiring 136a and 136b are electrically connected to the terminal electrodes 113a and 113b, respectively, and the second wiring 142a and 142b are electrically connected to the terminal electrodes 113c and 113d, respectively. Further, the oxide conductor film 171 may not be provided between the first wirings 136a and 136b and the second wirings 142a and 142b and the terminal electrodes 113~113d. The oxide conductor film 171, for example, is formed in the same layer as the conductive layer forming the pixel electrode 170. The oxide conductor film 171 is not an essential structure, but protects the surface of the terminal electrodes 113a~113d, and is preferably provided so as to prevent an increase in contact resistance from oxide.

In this way, according to the present embodiment, the first wiring 136 connected to the first detection electrode 134 and the second wiring 142 connected to the second detection electrode 140 may be sealed by the first inorganic insulating film 128 and the second inorganic insulating film 132, thus improving the reliability of the touch sensor.

As is shown in FIG. 5 and FIG. 7, since the first detection electrode 134 and the second detection electrode 140 are provided via the organic resin film 130, so even if foreign matter remains, short circuiting is prevented. Further, since the first wiring 136 connected to the first detection electrode 134 and the second wiring 142 connected to the second detection electrode 140 are located between the first inorganic insulating film 128 and the second inorganic insulating layer 132, respectively, and extend in different directions on the substrate 102, both wirings are insulated. With this structure, short circuiting in the detection electrodes and wiring that compose a touch panel may actually be securely prevented.

Furthermore, according to the present embodiment, the first detection electrode 134 and the second detection electrode 140 sandwich the organic resin film 130 in the sealing layer 126, reducing the thickness of the display device 100. Such a structure may also be applied to a substrate in the form of a sheet in which the substrate 102 is formed of an organic resin material, producing a flexible display into which the touch panel is built.

Embodiment 2

Figure 9:
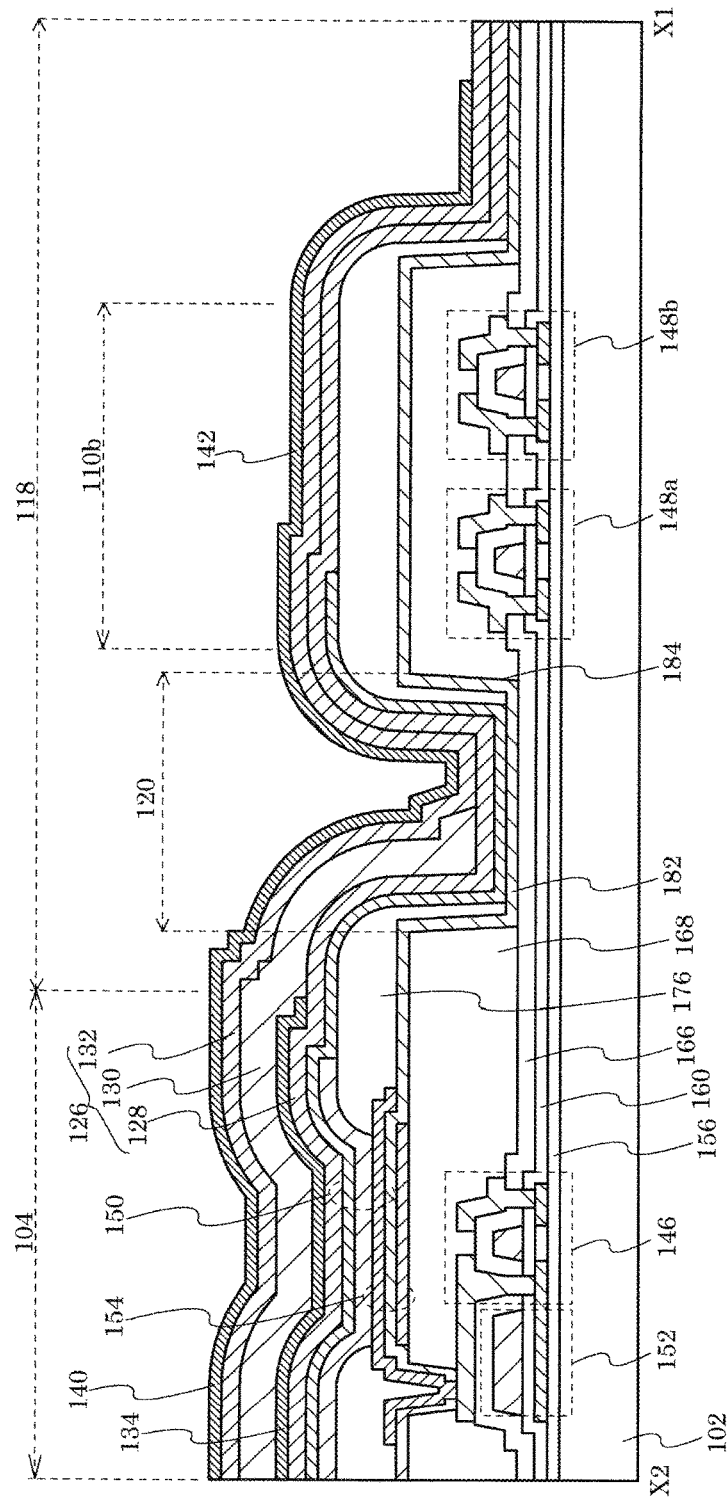
FIG. 9 is a cross-sectional view showing the structure of the display device according to an embodiment of the present invention.

FIG. 9 shows the structure of the display device according to one embodiment of the present invention. FIG. 9 shows a cross-section of the structure taken along line X1-X2 shown in FIG. 4. Further, the structure of the sealing layer 126, the first detection electrode 134, and the second detection electrode 140 shown in FIG. 9 corresponds to FIG. 3B.

As is shown in FIG. 9, the second detection electrode 140 and the second wiring 142 may not be provided on the upper layer side of the second inorganic insulating film 132. The organic resin film 130 is provided below the second detection electrode 140 and the second wiring 142. Unevenness is reduced by the organic resin film 130 below the second detection electrode 140 and the second wiring 142. Even if foreign matter is attached after the forming the first detection electrode 134, it may be embedded by the organic resin film 130. Unevenness of the surface from the first detection electrode 134 is reduced by the organic resin film 130. Furthermore, the first detection electrode 134 is securely insulated by the provision of the second inorganic insulating layer above the organic resin film 130. The structure of the first detection electrode 134 is the same as in the first embodiment.

According to the present embodiment, in addition to the function effect of the display device in embodiment 1, short-circuiting of both of the detection electrodes may be securely prevented by a plurality of insulation films in between the first detection electrode 134 and the second detection electrode 140.

Embodiment 3

Figure 10:
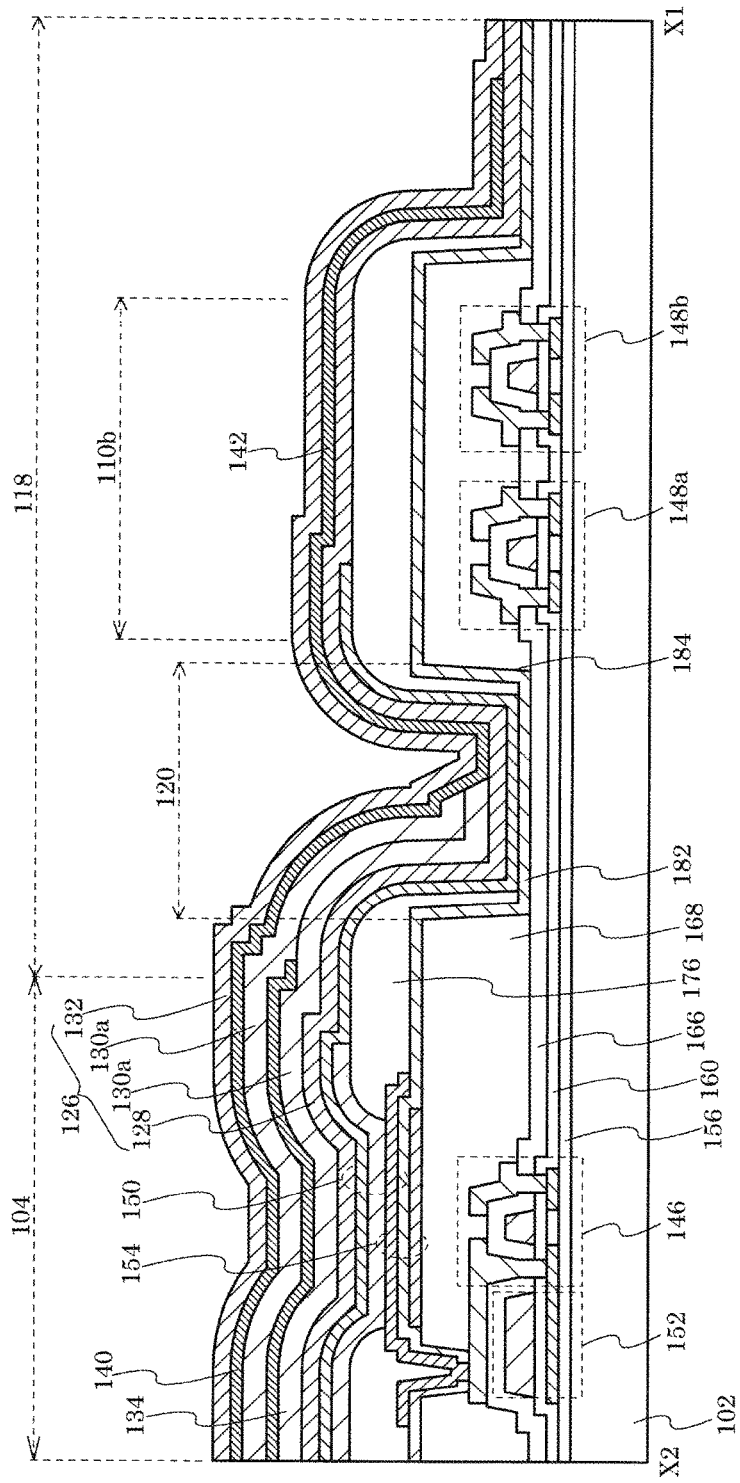
FIG. 10 is a cross-sectional view showing the structure of the display device according to an embodiment of the present invention.

FIG. 10 shows the structure of the display device according to one embodiment of the present invention. FIG. 10 shows a cross-section of the structure taken along line X1-X2 shown in FIG. 4. Further, the structure of the sealing layer 126, the first detection electrode 134, and the second detection electrode 140 shown in FIG. 10 correspond to FIG. 3C.

As is shown in FIG. 10, the organic resin film provided between the first inorganic insulating film 128 and the second inorganic insulating film 132 includes both the first organic resin film 130a and the second organic resin film 130b. That is to say, the first organic resin film 130a is provided above the first inorganic insulating film 128, and the second organic resin film 130b is stacked on top of the first organic resin film 130a. The second inorganic insulating film 132 is provided above the second organic resin film 130b.

The first detection electrode 134 is provided above the first organic resin film 130a. In other words, the first detection electrode 134 is located between the first organic resin film 130a and the second organic resin film 130b. Although not shown in FIG. 10, the first wiring 136 connecting the first detection electrode 134 is also the same. The first organic resin film 130a provided below the first detection electrode 134 embeds the unevenness of the underlying surface and planarizes the surface from the surface of the first inorganic insulating film 128. From this, it is possible to prevent the first detection electrode 134 from being disconnected due to the underlying uneven surface.

The second organic resin film 130b is provided above the first detection electrode 134. Even if foreign matter is attached after forming the first detection electrode 134, the foreign matter is embedded by the second organic resin film 130b. The unevenness of the surface from the first detection electrode 134 is reduced by the second organic resin film 130b. From this, the first detection electrode 134 and the second detection electrode 140 are insulated, preventing both detection electrodes from short circuiting. Further, the structure of the first detection electrode 134 is the same as in embodiment 1.

According to the present embodiment, in addition to the function effect of the display device in embodiment 1, since an organic resin film is provided below the first detection electrode 134 and the second detection electrode 140, the underlying surface is planarized, and disconnection of the first detection electrode 134 and the second detection electrode 140 may be prevented. Since at least the second organic resin layer 130b is located between the first detection electrode 134 and the second detection electrode 140, short circuiting of both detection electrodes may be prevented.

Embodiment 4

Figure 11:
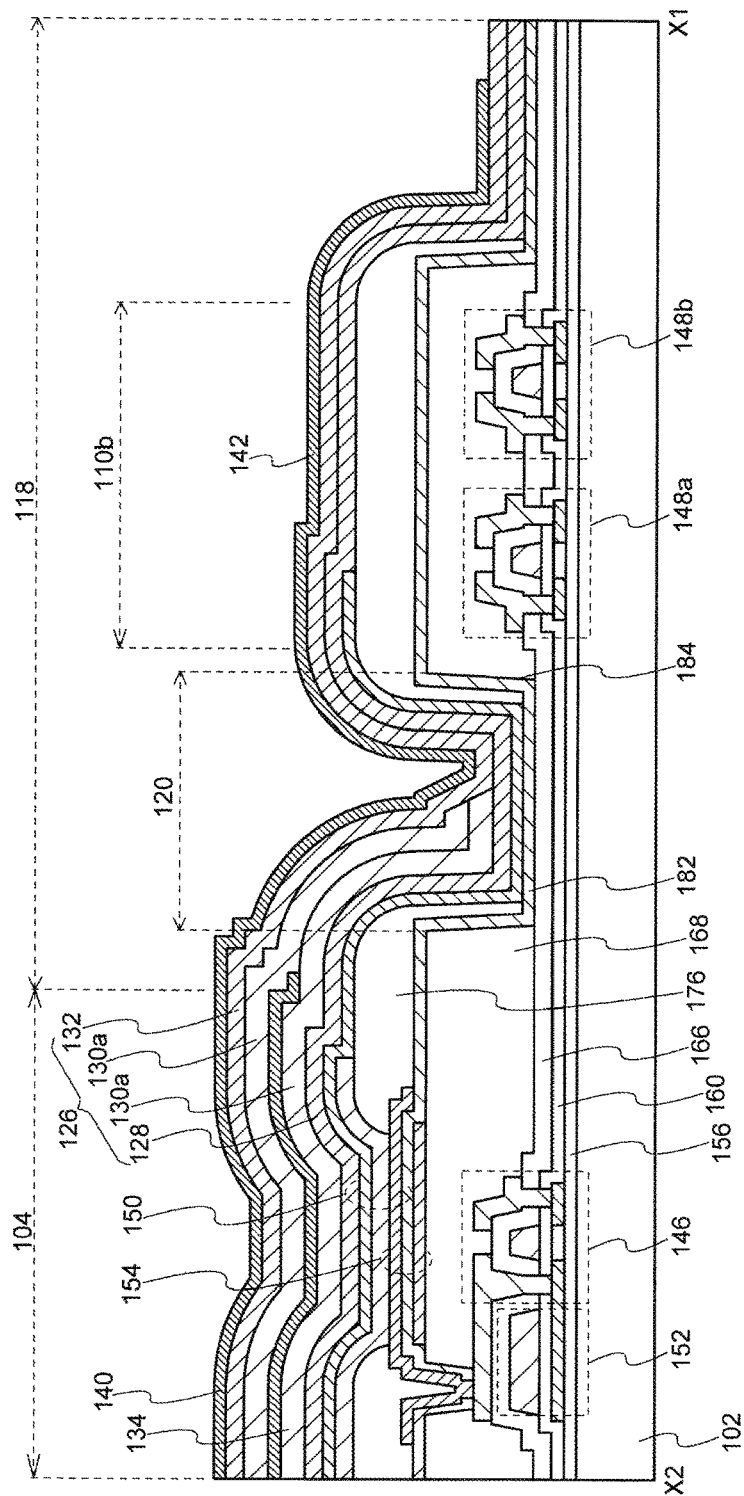
FIG. 11 is a cross-sectional view showing the structure of the display device according to an embodiment of the present invention.

FIG. 11 shows the structure of the display device according to one embodiment of the present invention. FIG. 11 shows a cross-section of the structure taken along line X1-X2 shown in FIG. 4. The structure of the sealing layer 126, the first detection electrode 134, and the second detection electrode 140 shown in FIG. 11 correspond to FIG. 3D.

As is shown in FIG. 11, the first detection electrode is provided between the first organic resin film 130a and the second organic resin film 130b, and the second detection electrode 140 and the second wiring 142 are provided above the second inorganic insulating film 132. The first organic resin film 130a and the second organic resin film 130b are provided below the second detection electrode 140 and the second wiring 142. Below the second detection electrode 140 and the second wiring 142, the unevenness is reduced by at least the second organic resin film 130b. Even if foreign matter is attached after forming the first detection electrode 134, it is embedded by the second organic resin film 130b. Further, the unevenness of the surface from the first detection electrode 134 is reduced by the second organic resin film 130b. Furthermore, since the second inorganic insulating film 132 is provided above the second organic resin film 130b, the first detection electrode 134 is securely insulated. The structure of the first detection electrode 134 is the same as in embodiment 1.

According to the present invention, in addition to the function effect of the display device in embodiment 1, since a plurality of insulation films are interposed between the first detection electrode 134 and the second detection electrode 140, short circuiting of both detection electrodes may be securely prevented.

What is claimed is:
1. A display device, comprising:
a substrate having a first surface and a second surface opposite the first surface;
a pixel region provided on the first surface of the substrate in which a plurality of pixels is arranged;
a peripheral region provided outside of the pixel region on the first surface of the substrate;
an organic electroluminescence element arranged in each of the plurality of pixels;
a sealing layer covering a surface of the pixel region on an opposite side of a substrate side of the pixel region;
a first detection electrode extending in a first direction on a first inorganic insulating film above the pixel region on a side of the pixel region where the sealing layer is provided;
a second detection electrode extending in a second direction intersecting the first direction on a different layer than the first detection electrode; and a polarization plate above the sealing layer, the polarization plate includes a polarizer having circular polarization, wherein the organic electroluminescence element includes a pixel electrode, an organic layer provided above the pixel electrode, and an opposite electrode provided above the organic layer, wherein the sealing layer includes at least an organic resin film, the first inorganic insulating film is provided above the opposite electrode and below the organic resin film, and a second inorganic insulating film provided is above the organic resin film, wherein a first surface of the first inorganic insulating film is in contact with the opposite electrode, a second surface of the first inorganic insulating film, opposite to the first surface of the first inorganic insulating film, is in contact with a first surface of the first detection electrode, a second surface of the first detection electrode, opposite to the first surface of the first detection electrode, is in contact with a first surface of the organic resin film, a second surface of the organic resin film, opposite to the first surface of the organic resin film, is in contact with a first surface of the second detection electrode, a second surface of the second detection electrode, opposite to the first surface of the second detection electrode, is in contact with a first surface of the second inorganic insulating film, wherein the pixel region and the peripheral region include at least one other inorganic insulating film on the substrate and at least one organic insulating film above the at least one other inorganic insulating film, wherein the peripheral region includes an opening portion in which the at least one organic insulating film is removed, and the opening portion continuously surrounds the pixel region in a plan view, wherein at least part of the first inorganic insulating film and the second inorganic insulating film are in contact with each other in the peripheral region, wherein the organic resin film is sandwiched between the first inorganic insulating film and the second inorganic insulating film in the pixel region and an edge of the organic resin film is located in the opening portion, and wherein the opposite electrode overlaps the opening portion.

2. The display device according to claim 1,
wherein the first detection electrode is arranged between the first inorganic insulating film and the organic resin film, and
wherein the second detection electrode is arranged above the second inorganic insulating film.

3. The display device according to claim 1,
wherein the organic resin film has a first organic resin film arranged on a layer above the first inorganic insulating film, and a second organic resin film arranged on a layer above the first organic resin film,
wherein the first detection electrode is arranged between the first organic resin film and the second organic resin film, and
wherein the second detection electrode is arranged between the second organic resin film and the second inorganic insulating film.

4. The display device according to claim 1,
wherein the organic resin film has a first organic resin film arranged on a layer above the first inorganic insulating film, and a second organic resin film arranged on a layer above the first organic resin film,
wherein the first detection electrode is arranged between the first organic resin film and the second organic resin film, and
wherein the second detection electrode is arranged on a layer above the second inorganic insulating film.

5. The display device according to claim 1,
wherein an end portion of the organic resin film is arranged in a region outside of the pixel region, and the first inorganic insulating film and the second inorganic insulating film are arranged extending to a region further outside than the end portion of the organic resin film.

6. The display device according to claim 1, further comprising:
a first wiring connected to the first detection electrode and a second wiring connected to the second detection electrode,
wherein the first wiring and the second wiring are sandwiched between the first inorganic insulating film and the second inorganic insulating film in the peripheral region.

7. The display device according to claim 6,
wherein the end portion of the organic resin film overlaps the opening portion, and the end portions of the first inorganic insulating film and the second inorganic insulating film are arranged on the outside of the opening portion.

8. The display device according to claim 6,
wherein the first wiring and the second wiring pass the opening portion and extend to the peripheral region.

9. The display device according to claim 6, further comprising:
a plurality of terminal electrode exposed from the first inorganic insulating film and the second inorganic insulating film above the substrate,
wherein the first wiring and the second wiring are connected to each of the plurality of terminal electrodes.

10. The display device according to claim 1,
wherein the organic resin film is one or more of an acrylic resin film, polyimide resin film, or epoxy resin film.

11. The display device according to claim 1,
wherein the first inorganic insulating film and the second inorganic insulating film are one or more of a silicon nitride film, silicon oxynitride film, or aluminum oxide film.

* * * * *